US006423599B1

(12) United States Patent
Yu

(10) Patent No.: US 6,423,599 B1
(45) Date of Patent: Jul. 23, 2002

(54) METHOD FOR FABRICATING A FIELD EFFECT TRANSISTOR HAVING DUAL GATES IN SOI (SEMICONDUCTOR ON INSULATOR) TECHNOLOGY

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/846,793

(22) Filed: May 1, 2001

(51) Int. Cl.⁷ .................... H01L 21/336; H01L 21/8238
(52) U.S. Cl. ................... 438/283; 438/216; 438/226
(58) Field of Search ................... 438/216, 217, 438/223, 227, 231, 232, 268, 269, 270, 283, 300, 305, 306, 593

(56) References Cited

U.S. PATENT DOCUMENTS

| | | | | |
|---|---|---|---|---|
| 5,164,805 A | * | 11/1992 | Lee | 257/351 |
| 5,885,887 A | * | 3/1999 | Hause et al. | 438/223 |
| 6,204,138 B1 | * | 3/2001 | Krishnan et al. | 438/151 |
| 6,284,594 B1 | * | 9/2001 | Ju et al. | 438/250 |
| 6,359,298 B1 | * | 3/2002 | Krishnan | 257/300 |
| 6,365,450 B1 | * | 4/2002 | Kim | 438/216 |
| 6,376,312 B1 | * | 4/2002 | Yu | 257/220 |

\* cited by examiner

Primary Examiner—Trung Dang
Assistant Examiner—Brook Kebede

(74) Attorney, Agent, or Firm—Monica H. Choi

(57) ABSTRACT

For fabricating a field effect transistor having dual gates, on a buried insulating layer in SOI (semiconductor on insulator) technology, a first layer of first semiconductor material is deposited on the buried insulating material. The first layer of first semiconductor material is patterned to form a first semiconductor island having a first top surface and a second semiconductor island having a second top surface. The first and second semiconductor islands are comprised of the first semiconductor material. An insulating material is deposited to surround the first and second semiconductor islands, and the insulating material is polished down until the first and second top surfaces of the first and second semiconductor islands are exposed such that sidewalls of the first and second semiconductor islands are surrounded by the insulating material. A gate dopant is implanted into the second semiconductor island. A layer of back gate dielectric material is deposited on the first and second top surfaces of the first and second semiconductor islands. An opening is patterned through the layer of back gate dielectric material above the first semiconductor island such that a bottom wall of the opening is formed by the first top surface of the first semiconductor island. A second layer of second semiconductor material is grown from the exposed first top surface of the first semiconductor island and onto the layer of back gate dielectric material. A front gate dielectric is formed over a portion of the second layer of second semiconductor material disposed over the second semiconductor island. A front gate electrode is formed over the front gate dielectric. The second semiconductor island forms a back gate electrode, and a portion of the layer of back gate dielectric material under the front gate dielectric forms a back gate dielectric.

13 Claims, 4 Drawing Sheets

METHOD FOR FABRICATING A FIELD EFFECT TRANSISTOR HAVING DUAL GATES IN SOI (SEMICONDUCTOR ON INSULATOR) TECHNOLOGY

TECHNICAL FIELD

The present invention relates generally to fabrication of field effect transistors having scaled-down dimensions, and more particularly, to fabrication of a field effect transistor having dual gates in SOI (semiconductor on insulator) technology, for minimizing short-channel effects in the field effect transistor.

BACKGROUND OF THE INVENTION

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100 are scaled down further, the junction capacitances formed by the drain and source extension junctions 104 and 106 and by the drain and source contact junctions 108 and 112 may limit the speed performance of the MOSFET 100. Thus, referring to FIG. 2, a MOSFET 150 is formed with SOI (semiconductor on insulator) technology. In that case, a layer of buried insulating material 152 is formed on the semiconductor substrate 102, and a layer of semiconductor material 154 is formed on the layer of buried insulating material 152. A drain 156 and a source 158 of the MOSFET 150 are formed in the layer of semiconductor material 154. Elements such as the gate dielectric 116 and the gate electrode 118 having the same reference number in FIGS. 1 and 2 refer to elements having similar structure and function. Processes for formation of such elements 116, 118, 152, 154, 156, and 158 of the MOSFET 150 are known to one of ordinary skill in the art of integrated circuit fabrication.

In FIG. 2, the drain 156 and the source 158 are formed to extend down to contact the layer of buried insulating material 152. Thus, because the drain 156, the source 158, and a channel region 160 of the MOSFET 150 do not form a junction with the semiconductor substrate 102, junction capacitance is minimized for the MOSFET 150 to enhance the speed performance of the MOSFET 150 formed with SOI (semiconductor on insulator) technology.

In addition, referring to FIGS. 1 and 2, as the dimensions of the MOSFETs 100 and 150 are scaled down further, the occurrence of undesired short-channel effects increases, as known to one of ordinary skill in the art of integrated circuit fabrication. With short-channel effects, the threshold voltage of the MOSFET changes such that electrical characteristics of such a MOSFET become uncontrollable, as known to one of ordinary skill in the art of integrated circuit fabrication. In the prior art MOSFETs 100 and 150 of FIGS. 1 and 2, the gate dielectric 116 and the gate electrode 118 are formed on one surface of the channel region of the MOSFET. However, for controlling the electrical characteristics of the MOSFET, forming a gate dielectric and a gate electrode on a plurality of surfaces of the channel region of the MOSFET is desired to minimize undesired short channel effects.

SUMMARY OF THE INVENTION

Accordingly, in a general aspect of the present invention, a field effect transistor is fabricated to have dual gates on two surfaces of the channel region of the field effect transistor formed in SOI (semiconductor on insulator) technology, to minimize undesired short channel effects.

In one embodiment of the present invention, in a method for fabricating a field effect transistor having dual gates, on a buried insulating layer in SOI (semiconductor on insulator) technology, a first layer of first semiconductor material is deposited on the buried insulating material. The first layer of first semiconductor material is patterned to form a first semiconductor island having a first top surface and a second semiconductor island having a second top surface. The first and second semiconductor islands are comprised of the first semiconductor material. An insulating material is deposited to surround the first and second semiconductor islands, and the insulating material is polished down until the first and second top surfaces of the first and second semiconductor islands are exposed such that sidewalls of the first and second semiconductor islands are surrounded by the insulating material.

In addition, a gate dopant is implanted into the second semiconductor island. A layer of back gate dielectric material is deposited on the first and second top surfaces of the first and second semiconductor islands. An opening is patterned through the layer of back gate dielectric material above the first semiconductor island such that a bottom wall of the opening is formed by the first top surface of the first semiconductor island. A second layer of second semiconductor material is grown from the exposed first top surface of the first semiconductor island and onto the layer of back gate dielectric material. A front gate dielectric is formed over a portion of the second layer of second semiconductor material disposed over the second semiconductor island. A front gate electrode is formed over the front gate dielectric. The second semiconductor island forms a back gate electrode, and a portion of the layer of back gate dielectric material under the front gate dielectric forms a back gate dielectric.

The present invention may be used to particular advantage when the first semiconductor material forming the first and second semiconductor islands are comprised of silicon and when the second layer of second semiconductor material is silicon epitaxially grown from the top surface of the first semiconductor island through the opening in the layer of back gate dielectric material.

In this manner, the back gate dielectric and the back gate electrode are formed on a bottom surface of the channel region of the field effect transistor, and the front gate dielectric and the front gate electrode are formed on a top surface of the channel region of the field effect transistor. With formation of such gate dielectrics and gate electrodes on a plurality of surfaces of the channel region of the field effect transistor, electrical characteristics of the field effect transistor are better controlled to minimized undesired short channel effects. In addition, because the field effect transistor is formed in SOI (semiconductor on insulator) technology, junction capacitance is minimized to enhance the speed performance of the field effect transistor.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, and 14 refer to elements having similar structure and function.

DETAILED DESCRIPTION

Figure 1:
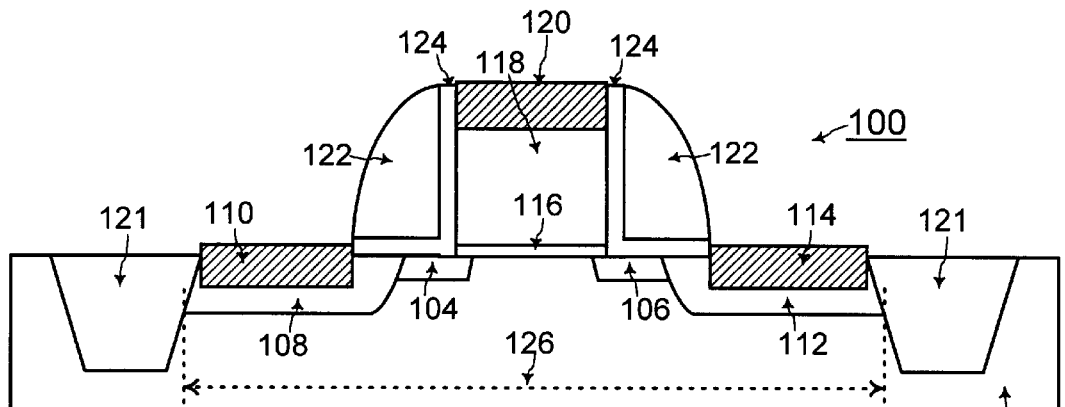
FIG. 1 shows a cross-sectional view of a conventional MOSFET (Metal Oxide Semiconductor Field Effect Transistor) fabricated within a semiconductor substrate, without dual gate dielectrics and gate electrodes formed on a plurality of surfaces of the channel region, according to the prior art.
Figure 2:
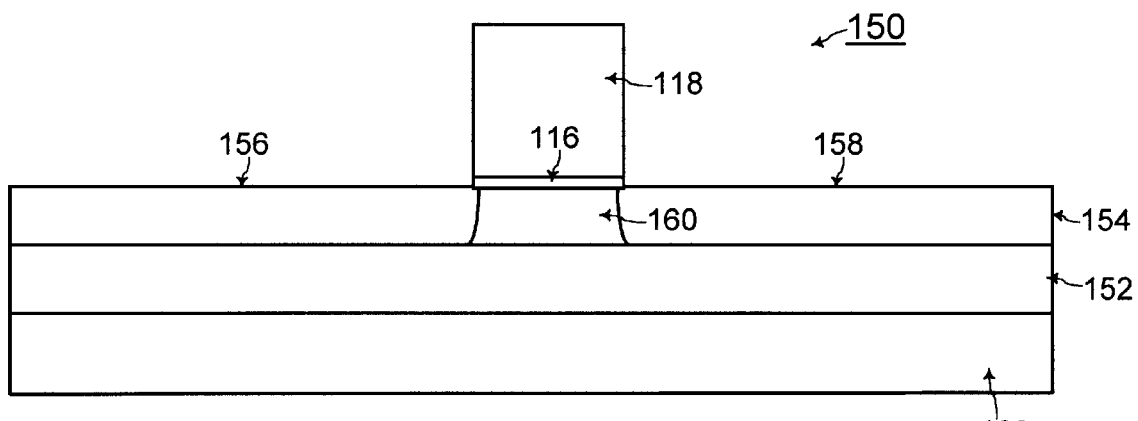
FIG. 2 shows a cross-sectional view of a MOSFET (Metal Oxide Semiconductor Field Effect Transistor) fabricated with SOI (semiconductor on insulator) technology for minimizing junction capacitance, without dual gate dielectrics and gate electrodes formed on a plurality of surfaces of the channel region, according to the prior art.
Figure 3:
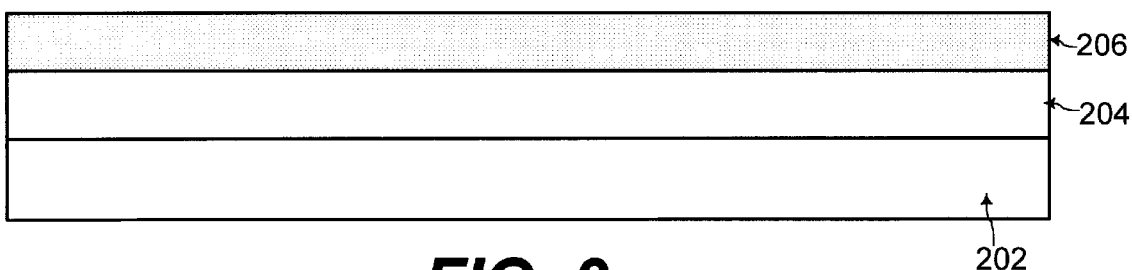
FIGS. 3, 4, 5, 6, 7, 8, 9, 10, 11, 12, 13, and 14 show cross-sectional views for illustrating the steps for fabricating a field effect transistor to have dual gates on two surfaces of the channel region of the field effect transistor formed in SOI (semiconductor on insulator) technology, to minimize undesired short channel effects according to an embodiment of the present invention.

In the cross-sectional view of FIG. 3, for fabricating a MOSFET (Metal Oxide Semiconductor Field Effect Transistor) with SOI (semiconductor on insulator) technology, a layer of buried insulating material 204 is deposited on a semiconductor substrate 202. In one embodiment of the present invention, the layer of buried insulating material 204 is comprised of silicon dioxide ($SiO_2$) 204 deposited on the semiconductor substrate 202 comprised of silicon. Processes for deposition of the layer of buried insulating material 204 on the semiconductor substrate 202 are known to one of ordinary skill in the art of integrated circuit fabrication.

Further referring to FIG. 3, a first layer of first semiconductor material 206 is deposited on the layer of buried insulating material 204. In one embodiment of the present invention, the first layer of first semiconductor material 206 is comprised of silicon having a thickness in a range of from about 500 angstroms to about 1000 angstroms. Processes for deposition of the first layer of first semiconductor material 206 on the layer of buried insulating material 204 are known to one of ordinary skill in the art of integrated circuit fabrication.

Figure 4:
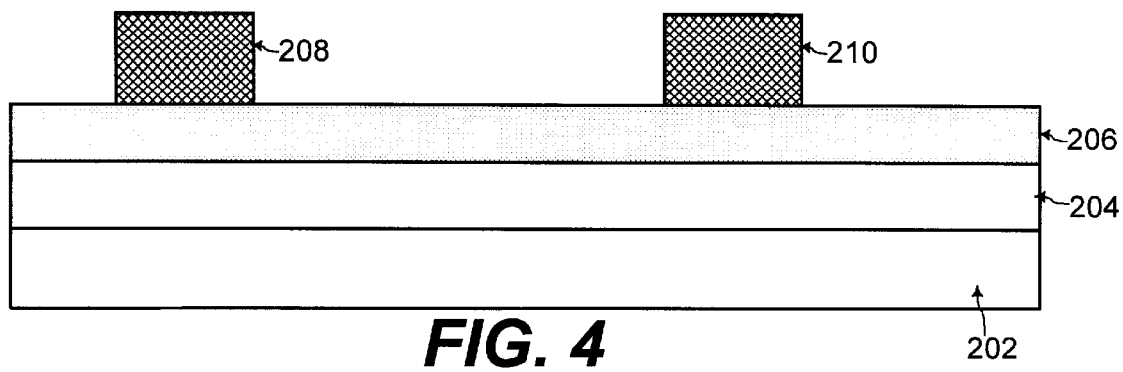

Referring to FIG. 4, a first masking structure 208 and a second masking structure 210 are formed on the first layer of first semiconductor material 206. The first and second masking structures 208 and 210 are comprised of photoresist material according to one embodiment of the present invention. Processes for patterning photoresist material to form the first and second masking structures 208 and 210 are known to one of ordinary skill in the art of integrated circuit fabrication.

Figure 5:
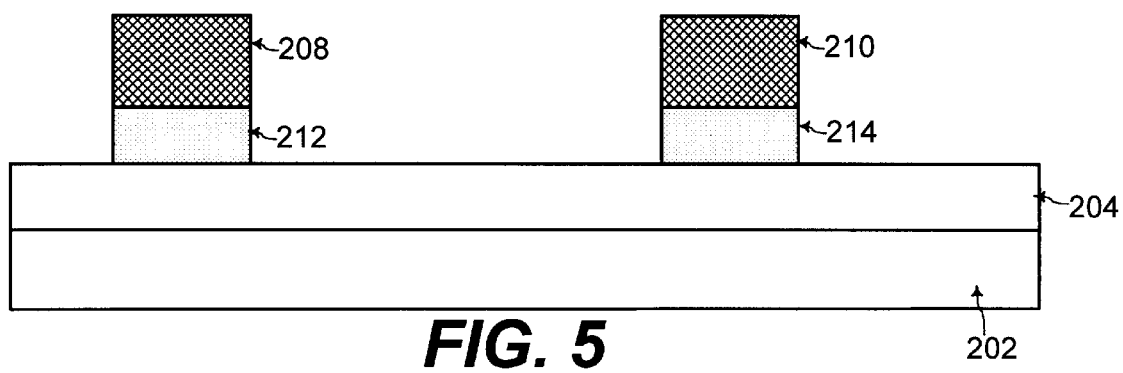

Referring to FIG. 5, any exposed regions of the first layer of first semiconductor material 206 not under the first and second masking structures 208 and 210 are etched away to form a first semiconductor island 212 and a second semiconductor island 214. The first semiconductor island 212 is comprised of the first semiconductor material 206 remaining under the first masking structure 208, and the second semiconductor island 214 is comprised of the first semiconductor material 206 remaining under the second masking structure 210. Processes for etching away the exposed regions of the first layer of first semiconductor material 206 which is comprised of silicon for example are known to one of ordinary skill in the art of integrated circuit fabrication.

Figure 6:
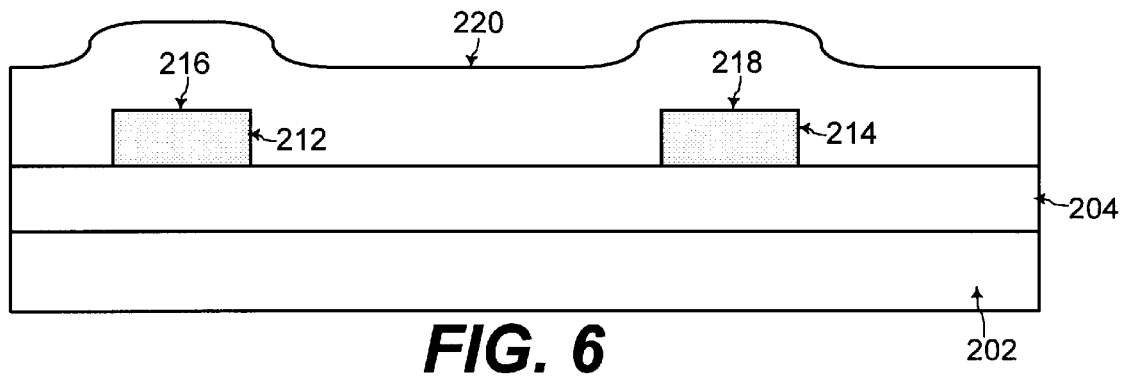

Referring to FIG. 6, the first and second masking structures 208 and 210 are etched away from a first top surface 216 of the first semiconductor island 212 and from a second top surface 218 of the second semiconductor island 214. Processes for etching away the first and second masking structures 208 and 210 which are comprised of photoresist material for example are known to one of ordinary skill in the art of integrated circuit fabrication.

Further referring to FIG. 6, an insulating material 220 is conformally deposited to surround the first and second semiconductor islands 212 and 214. The insulating material 220 is conformally deposited to surround the top surfaces 216 and 218 and the sidewalls of the first and second semiconductor islands 212 and 214. The insulating material 220 is comprised of silicon dioxide ($SiO_2$) having a thickness in a range of from about 2,000 angstroms to about 3,000 angstroms according to one example embodiment of the present invention. Processes for conformally depositing such an insulating material 220 are known to one of ordinary skill in the art of integrated circuit fabrication.

Figure 7:
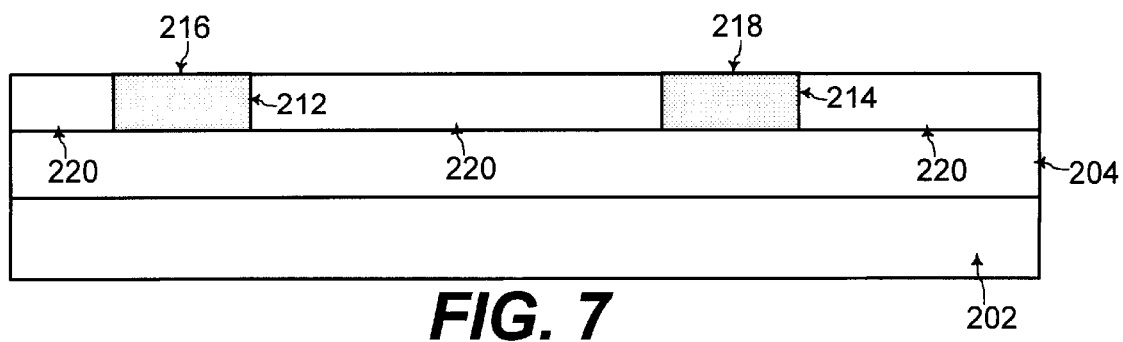
Figure 8:
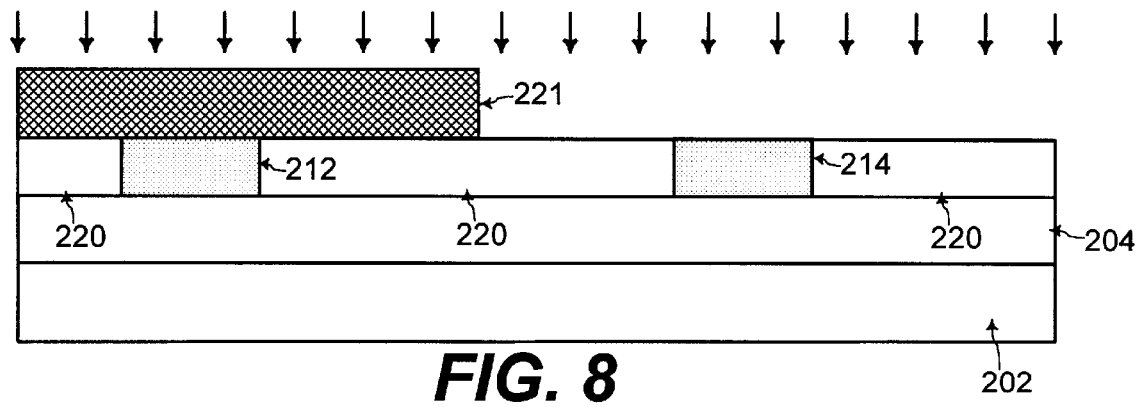

Referring to FIG. 7, the insulating material 220 is polished down until the top surfaces 216 and 218 of the first and second semiconductor islands 212 and 214 are exposed. Processes such as CMP (chemical mechanical polishing)

processes for polishing down the insulating material 220 are known to one of ordinary skill in the art of integrated circuit fabrication. Referring to FIG. 8, a gate dopant is implanted into the second semiconductor island 214 while a masking structure 221 is patterned to cover the first semiconductor island 212. The masking structure 221 is comprised of photoresist material according to one embodiment of the present invention, and processes for patterning the masking structure 221 are known to one of ordinary skill in the art of integrated circuit fabrication. The masking structure 221 blocks the gate dopant from being implanted into the first semiconductor island 212.

Referring to FIG. 8, the gate dopant is an N-type dopant such as phosphorous or arsenic for example for fabrication of an NMOSFET (N-channel Metal Oxide Semiconductor Field Effect Transistor). Alternatively, the gate dopant is a P-type dopant such as boron for example for fabrication of a PMOSFET (P-channel Metal Oxide Semiconductor Field Effect Transistor). Processes for implantation of such a gate dopant are known to one of ordinary skill in the art of integrated circuit fabrication.

Figure 9:
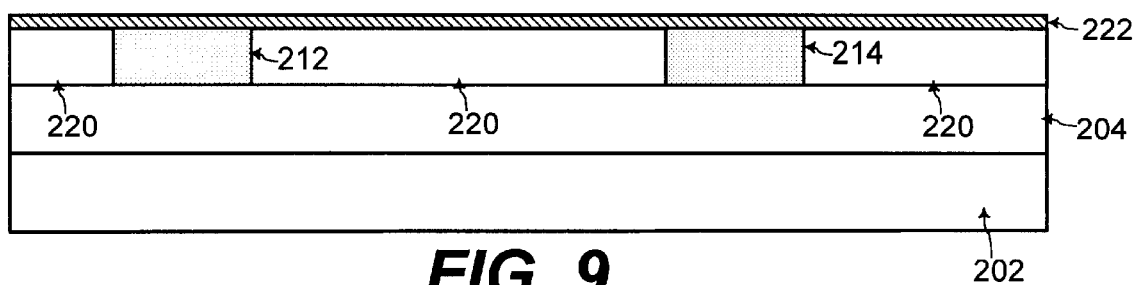

Referring to FIG. 9, a layer of back gate dielectric material 222 is deposited on the exposed top surfaces 216 and 218 of the first and second semiconductor islands 212 and 214. The layer of back gate dielectric material 222 is comprised of a dielectric material having a dielectric constant that is higher than that of silicon dioxide ($SiO_2$). In one embodiment of the present invention, the layer of back gate dielectric material 222 is comprised of silicon nitride ($Si_3N_4$). When the layer of back gate dielectric material 222 has a dielectric constant that is higher than the dielectric constant of silicon dioxide ($SiO_2$), the layer of back gate dielectric material 222 has a higher thickness than if the layer of back gate dielectric material 222 were comprised of silicon dioxide ($SiO_2$) to minimize undesired tunneling current through the layer of back gate dielectric material 222. Processes for depositing such a layer of back gate dielectric material 222 are known to one of ordinary skill in the art of integrated circuit fabrication.

Figure 10:
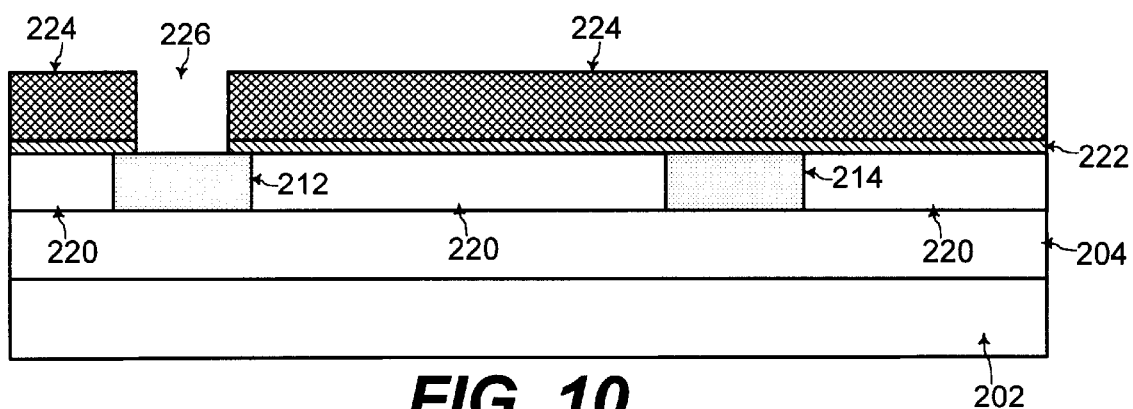

Referring to FIG. 10, a layer of masking material 224 such as photoresist material for example is patterned to form an opening 226 through the layer of back gate dielectric material 222. The opening 226 through the layer of back gate dielectric material 222 is disposed over the first semiconductor island 212 such that the top surface 216 of the first semiconductor island 212 forms the bottom wall of the opening 226. Processes for patterning the layer of masking material 224 which is comprised of photoresist material for example and for etching the opening 226 through the layer of back gate dielectric material 222 are known to one of ordinary skill in the art of integrated circuit fabrication.

Figure 11:
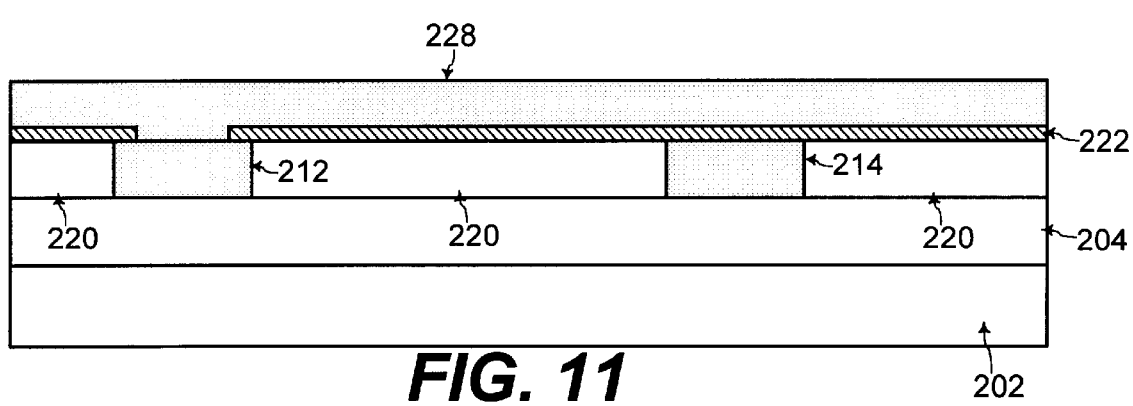

Referring to FIG. 11, a second layer of second semiconductor material 228 is grown from the top surface 216 of the first semiconductor island 212, through the opening 226 of the layer of back gate dielectric material 222, and onto the layer of back gate dielectric material 222. In one embodiment of the present invention, the second layer of second semiconductor material 228 is comprised of silicon that is epitaxially grown from the top surface 216 of the first semiconductor island 212 that is comprised of silicon. Processes for epitaxially growing such a second layer of second semiconductor material 228 from the top surface 216 of the first semiconductor island 212 are known to one of ordinary skill in the art of integrated circuit fabrication.

Figure 12:
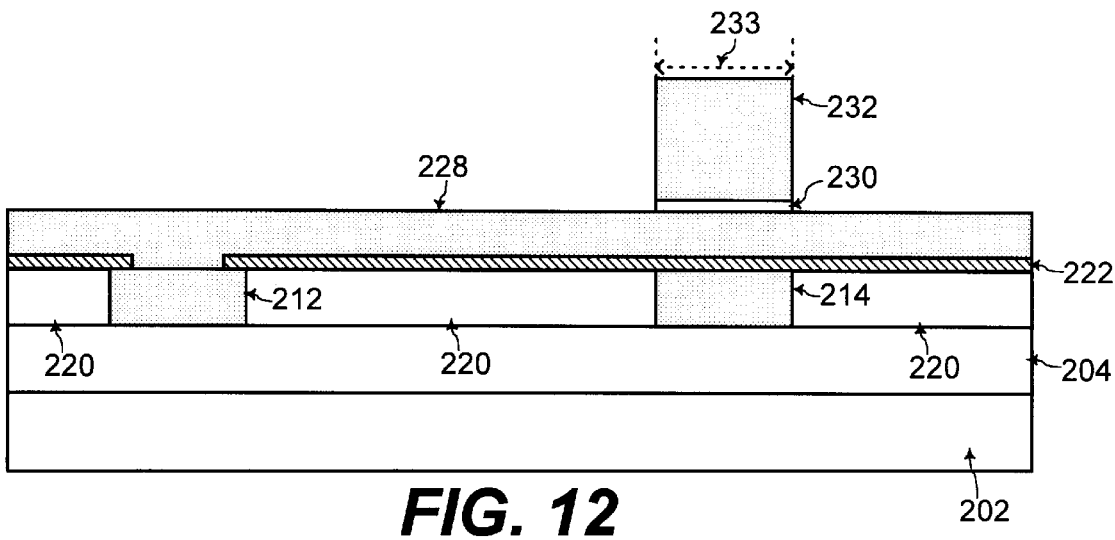

Referring to FIG. 12, a front gate dielectric 230 is formed on the second layer of second semiconductor material 228 over the second semiconductor island 214. A front gate electrode 232 is formed on the front gate dielectric 230. In one embodiment of the present invention, the front gate dielectric 230 is comprised of a dielectric material such as a metal oxide having a dielectric constant that is higher than that of silicon dioxide ($SiO_2$). When the front gate dielectric 230 is comprised of a dielectric material having a dielectric constant that is higher than the dielectric constant of silicon dioxide ($SiO_2$), the front gate dielectric 230 has a higher thickness than if the front gate dielectric 230 were comprised of silicon dioxide ($SiO_2$) to minimize undesired tunneling current through the front gate dielectric 230. Processes for forming such a front gate dielectric 230 are known to one of ordinary skill in the art of integrated circuit fabrication.

In one embodiment of the present invention, the front gate electrode 232 formed on the front gate dielectric 230 is comprised of polysilicon. In an example embodiment of the present invention, the length 233 of the front gate electrode 232 is in a range of from about 20 nanometers to about 100 nanometers. In that case, in the example embodiment of the present invention, the thickness of the layer of back gate dielectric material 222 has a thickness in a range of from about 10 angstroms to about 30 angstroms. Processes for formation of such a front gate electrode 232 formed on the front gate dielectric 230 are known to one of ordinary skill in the art of integrated circuit fabrication.

Figure 13:
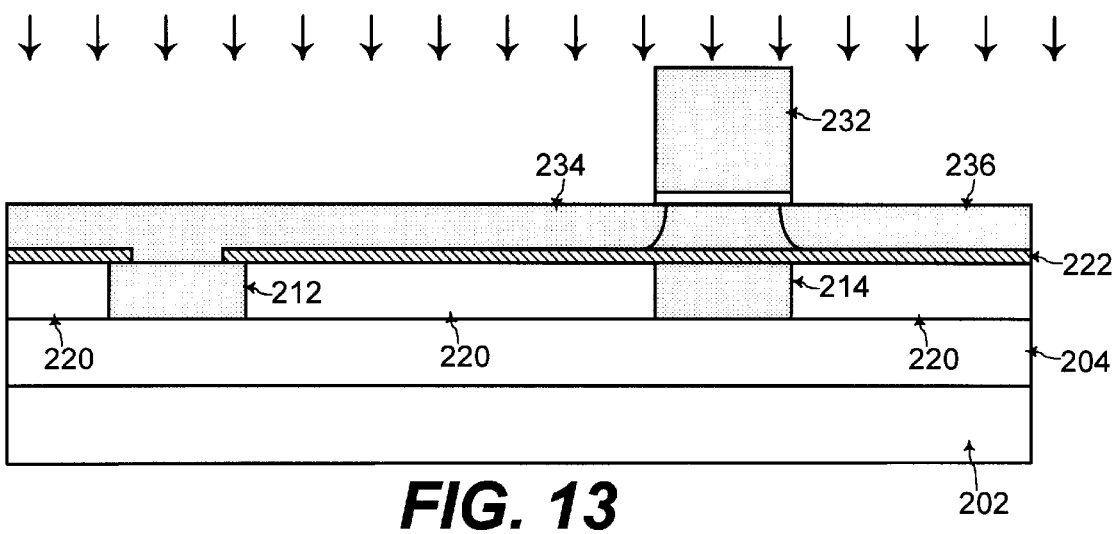

Referring to FIG. 13, a drain and source dopant is implanted into exposed regions of the second layer of second semiconductor material 228 to form a drain region 234 and a source region 236 that extend down to contact the layer of back gate dielectric material 222. The channel region of the MOSFET is the portion of the second layer of second semiconductor material 228 disposed under the front gate dielectric 230 between the drain region 234 and the source region 236. When the front gate electrode 232 is a semiconductor material such as polysilicon for example, the drain and source dopant is also implanted into the front gate electrode 232.

Figure 14:
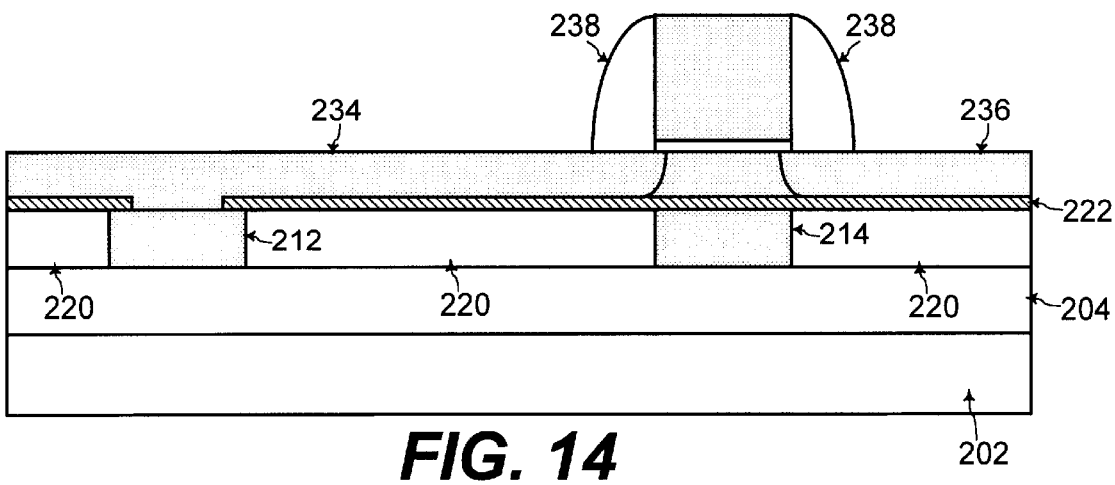

The drain and source dopant is an N-type dopant for forming the drain region 234 and the source region 236 of an NMOSFET (N-channel Metal Oxide Semiconductor Field Effect Transistor). Alternatively, the drain and source dopant is a P-type dopant for forming the drain region 234 and the source region 236 of a PMOSFET (P-channel Metal Oxide Semiconductor Field Effect Transistor). Processes for implantation of such a dopant are known to one of ordinary skill in the art of integrated circuit fabrication. After implantation of the drain and source dopant, a thermal anneal is performed to activate the drain and source dopant in the drain region 234, the source region 236, and the front gate electrode 232, and the gate dopant in the second semiconductor island 214. Thermal anneal processes for activating dopant are known to one of ordinary skill in the art of integrated circuit fabrication. Referring to FIG. 14, spacers 238 are formed on the sidewalls of the front gate dielectric 230 and the front gate electrode 232. The spacers 238 are comprised of silicon dioxide ($SiO_2$) according to one embodiment of the present invention, and processes for formation of such spacers 238 are known to one of ordinary skill in the art of integrated circuit fabrication.

In this manner, the second semiconductor island 214 forms a back gate electrode, and a portion of the layer of back gate dielectric material 222 under the front gate dielectric 230 forms a back gate dielectric of the MOSFET. The back gate dielectric and the back gate electrode 214 are formed on a bottom surface of the channel region of the MOSFET, and the front gate dielectric 230 and the front gate electrode 232 are formed on a top surface of the channel region of the MOSFET. With formation of such gate dielectrics and gate electrodes on a plurality of surfaces of the channel region of the MOSFET, electrical characteristics of the MOSFET are better controlled to minimized undesired short channel effects. In addition, because the MOSFET is formed in SOI (semiconductor on insulator) technology, junction capacitance is minimized to enhance the speed performance of the MOSFET.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "over," "sidewall," "below," "top," "bottom," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor having dual gates, on a buried insulating layer in SOI (semiconductor on insulator) technology, the method including the steps of:

A. depositing a first layer of first semiconductor material on said buried insulating material;

B. patterning said first layer of first semiconductor material to form a first semiconductor island having a first top surface and a second semiconductor island having a second top surface, wherein said first and second semiconductor islands are comprised of said first semiconductor material;

C. depositing an insulating material to surround said first and second semiconductor islands;

D. polishing down said insulating material until said first and second top surfaces of said first and second semiconductor islands are exposed, and such that sidewalls of said first and second semiconductor islands are surrounded by said insulating material;

E. implanting a gate dopant into said second semiconductor island;

F. depositing a layer of back gate dielectric material on said first and second top surfaces of said first and second semiconductor islands;

G. patterning an opening through said layer of back gate dielectric material above said first semiconductor island such that a bottom wall of said opening is formed by said first top surface of said first semiconductor island;

H. growing a second layer of second semiconductor material from said exposed first top surface of said first semiconductor island and onto said layer of back gate dielectric material;

I. forming a front gate dielectric over a portion of said second layer of second semiconductor material disposed over said second semiconductor island; and J. forming a front gate electrode over said front gate dielectric, wherein said second semiconductor island forms a back gate electrode, and wherein a portion of said layer of back gate dielectric material under said front gate dielectric forms a back gate dielectric.

2. The method of claim 1, further including the step of:

implanting a drain and source dopant into exposed portions of said second layer of second semiconductor material to form a drain region and a source region of said field effect transistor; and forming spacers comprised of silicon dioxide ($SiO_2$) on sidewalls of said front gate dielectric and said front gate electrode.

3. The method of claim 1, wherein said buried insulating material is comprised of silicon dioxide ($SiO_2$) formed on a silicon substrate, and wherein said first layer of first semiconductor material is comprised of silicon having a thickness in a range of from about 500 angstroms to about 1000 angstroms.

4. The method of claim 3, wherein said second layer of second semiconductor material is comprised of silicon epitaxially grown from said exposed first top surface of said first semiconductor island.

5. The method of claim 1, wherein said back dielectric material has a dielectric constant that is higher than that of silicon dioxide ($SiO_2$).

6. The method of claim 5, wherein said back dielectric material is comprised of silicon nitride ($Si_3N_4$).

7. The method of claim 6, wherein a length of said front gate electrode is in a range of from about 20 nanometers to about 100 nanometers, and wherein said layer of back gate dielectric material has a thickness in a range of from about 10 angstroms to about 30 angstroms.

8. The method of claim 1, wherein said insulating material deposited in said step C is comprised of silicon dioxide ($SiO_2$).

9. The method of claim 1, wherein said first semiconductor island is covered with a masking structure comprised of photoresist material during implantation of said gate dopant into said second semiconductor island in said step E.

10. The method of claim 1, wherein said gate dopant implanted into said second semiconductor island during said step E is comprised of an N-type dopant for fabrication of an NMOSFET (N-channel Metal Oxide Semiconductor Field Effect Transistor).

11. The method of claim 1, wherein said gate dopant implanted into said second semiconductor island during said step E is comprised of a P-type dopant for fabrication of a PMOSFET (P-channel Metal Oxide Semiconductor Field Effect Transistor).

12. The method of claim 1, wherein said front gate dielectric is comprised of a dielectric material having a dielectric constant that is higher than that of silicon dioxide ($SiO_2$), and wherein said front gate electrode is comprised of polysilicon.

13. A method for fabricating a MOSFET (Metal Oxide Semiconductor Field Effect Transistor) having dual gates, on a buried insulating layer comprised of silicon dioxide ($SiO_2$) formed on a silicon substrate, in SOI (semiconductor on insulator) technology, the method including the steps of:

A. depositing a first layer of first semiconductor material on said buried insulating material;

wherein said first layer of first semiconductor material is comprised of silicon having a thickness in a range of from about 500 angstroms to about 1000 angstroms;

B. patterning said first layer of first semiconductor material to form a first semiconductor island having a first top surface and a second semiconductor island having a second top surface, wherein said first and second semiconductor islands are comprised of said first semiconductor material;

C. depositing an insulating material comprised of silicon dioxide ($SiO_2$) to surround said first and second semiconductor islands;

D. polishing down said insulating material until said first and second top surfaces of said first and second semiconductor islands are exposed, and such that sidewalls of said first and second semiconductor islands are surrounded by said insulating material;

E. implanting a gate dopant into said second semiconductor island;

wherein said first semiconductor island is covered with a masking structure comprised of photoresist material during implantation of said gate dopant into said second semiconductor island;

and wherein said gate dopant implanted into said second semiconductor island is comprised of an N-type dopant for fabrication of an NMOSFET (N-channel Metal Oxide Semiconductor Field Effect Transistor);

or wherein said gate dopant implanted into said second semiconductor island is comprised of a P-type dopant for fabrication of a PMOSFET (P-channel Metal Oxide Semiconductor Field Effect Transistor);

F. depositing a layer of back gate dielectric material on said first and second top surfaces of said first and second semiconductor islands;

wherein said back dielectric material is comprised of silicon nitride ($Si_3N_4$) having a thickness in a range of from about 10 angstroms to about 30 angstroms;

G. patterning an opening through said layer of back gate dielectric material above said first semiconductor island such that a bottom wall of said opening is formed by said first top surface of said first semiconductor island;

H. growing a second layer of second semiconductor material from said exposed first top surface of said first semiconductor island and onto said layer of back gate dielectric material;

wherein said second layer of second semiconductor material is comprised of silicon epitaxially grown from said exposed first top surface of said first semiconductor island;

I. forming a front gate dielectric over a portion of said second layer of second semiconductor material disposed over said second semiconductor island;

J. forming a front gate electrode over said front gate dielectric, wherein said second semiconductor island forms a back gate electrode, and wherein a portion of said layer of back gate dielectric material under said front gate dielectric forms a back gate dielectric;

and wherein a length of said front gate electrode is in a range of from about 20 nanometers to about 100 nanometers;

and wherein said front gate dielectric is comprised of a dielectric material having a dielectric constant that is higher than that of silicon dioxide ($SiO_2$), and wherein said front gate electrode is comprised of polysilicon;

K. implanting a drain and source dopant into exposed portions of said second layer of second semiconductor material to form a drain region and a source region of said MOSFET; and L. forming spacers comprised of silicon dioxide ($SiO_2$) on sidewalls of said front gate dielectric and said front gate electrode.

\* \* \* \* \*